United States Patent [19]

Kloucek

[11] Patent Number: 5,037,801
[45] Date of Patent: Aug. 6, 1991

[54] METHOD FOR PRODUCING A WIRE- OR BAND-SHAPED CERAMIC SUPERCONDUCTOR

[75] Inventor: Franz Kloucek, Wettingen, Switzerland

[73] Assignee: Asea Brown Boveri Ltd., Baden, Switzerland

[21] Appl. No.: 420,879

[22] Filed: Oct. 13, 1989

[30] Foreign Application Priority Data

Oct. 19, 1988 [CH] Switzerland ............... 3902/88

[51] Int. Cl.$^5$ ........................................... H01L 39/12
[52] U.S. Cl. .................................... 505/1; 264/63; 264/211.11; 264/211.12; 505/740
[58] Field of Search .............. 264/56, 63, 211.11, 264/211.17, 177.11; 505/1, 704, 740, 725, 739, 780

[56] References Cited

FOREIGN PATENT DOCUMENTS 1-57454  6/1989  Japan .

OTHER PUBLICATIONS

Journal of Materials Science Letters, vol. 7, No. 3, Mar. 1988, (London, GB), pp. 283–284, T. Goto, et al., "Wet Spinning of a Single Layered Perovskite Y–Ba–Cu–O Superconductors".
Solid State Communications, vol. 66, No. 7, Apr. 1988, Pergamon Press plc (GB), pp. 735–738, P. Murugaraj, et al., "Preparation of Highly Oriented Polycrystalline $YBa_{2-y}Cu_3O_x$ Superconductors".
J. Am. Ceram. Soc. 70, Dec. 1987, C-388–C-390, I-Wei Chen, et al., "Texture Development in $YBa_2Cu_3O_x$ by Hot Extrusion and Hot-Pressing".
Japanese Journal of Applied Physics, vol. 26, No. 7, Jul. 1987, pp. L1197–L1198, S. Hayashi, et al., "Growth of $YBa_2Cu_3O_{9-8}$ Single Crystals from the High Temperature Solution".
Appl. Phys. Letters 51, 1987, 1040–1042, D. L. Kaiser, et al., "Growth of $YBa_2Cu_3O_x$ Single Crystals".
J. Phys. E:Sci. Instrum. 20, 1987, 1292–1293, S. Vieira, et al., "A Simple Device for Quick Separation of High--Tc Superconducting Materials".
Trans. Brit. Ceram. Soc. 55, 1956, 57–74, A. L. Stuijts, "Sintering of Ceramic Permanent Magnetic Material".

Primary Examiner—James Lowe
Assistant Examiner—Christopher A. Fiorilla
Attorney, Agent, or Firm—Oblon, Spivak, McClelland, Maier & Neustadt

[57] ABSTRACT

Production of a wire-shaped ceramic high-temperature superconductor based on $(Y,SE)Ba_2Cu_3O_{6.5+y}$ with SE = rare earth metal and $0 < y < 1$, in which 80 to 95% by weight of an ultra-fine grained powder (1) of globulitic particles having a maximum diameter of 1 $\mu$m are processed with 0.5 to 3% by weight of a powder (3) of needle- and plate-shaped particles having a length of 10 to 50 $\mu$m and 4 to 20% by weight of an organic binder with solvent (5) to form a highly viscous slip (7) and is extruded to form a strand (10) having longitudinally oriented needle- and plate-shaped particles and this is dried in air, calcined and sintered to form a fiber (13).

4 Claims, 2 Drawing Sheets

METHOD FOR PRODUCING A WIRE- OR BAND-SHAPED CERAMIC SUPERCONDUCTOR

BACKGROUND OF THE INVENTION

1. Field of the Invention

Technology of electric superconductors. The significance of materials having superconducting characteristics has been increasing more and more in recent times. The discovery of new superconducting materials, particularly of the rare earth/Ba/Cu/O type led to a considerable expansion in possible applications for superconductors since these materials already become superconducting at temperatures above 50K.

The invention relates to the further development and improvement of products from a ceramic high-temperature superconductors, taking into account the requirements of large-scale industrial production.

In particular, it relates to a method for producing a wire- or band-shaped ceramic high-temperature superconductor based on superconducting ceramics of the $(Y,SE)Ba_2Cu_3O_{6.5+y}$ class with SE=rare earth metal and $0<y<1$.

2. Discussion of Background

It has been found that ceramic high-temperature superconductors of the $SEBa_2Cu_3O_{6.5+y}$ class (SE=rare earth metal, $0<y<1$) have highly anisotropic characteristics in every regard. This is connected with the crystal structure (perovskite lattice) and particularly applies to i the critical current density, $j_c$ (current carrying capability). The grain boundaries in polycrystallized ceramics limit the critical current densities to small values so that these materials are not suitable for most technical applications at the boiling temperature of liquid nitrogen (T=77K). Hitherto, critical current densities, $j_c$, up to a maximum of 1000 A/cm² have been measured for sintered samples of polycrystalline $YBa_2Cu_3O_{\sim 7}$. Applications in, for example, magnet coils, however, require current densities which are higher by a factor of about 100.

The above shows that, compared with erratically and statistically arbitrarily arranged crystallites, much higher critical current densities can be expected from an oriented crystallite structure. The highest current densities, $j_c$, of more than $10^5$ A/cm² were observed in thin superconductor layers epitaxially grown on $SrTiO_3$ monocrystals. However, this method requires extensive monocrystals as substrates and cannot be used for producing wires (multiple filaments/and bands of great length).

Textures with preferred orientation of the crystallite axes can also be achieved by hot pressing and hot extrusion of ceramic powders. However, nothing is known about the current carrying capability of such products. In addition, these methods cannot really be used for producing wire- or band-shaped superconductors.

It is known that calcined powders, for example of the $YBa_2Cu_3O_{\sim 7}$ compound, can have a needle-shaped or plate-shaped particle morphology which originates from growth anisotropies. The short axis of these particles crystallographically corresponds to the c axis of the lattice. The long axes of the particles reproduce a- or b-axis of the lattice and these directions can accommodate distinctly higher critical currents than the c axis. Plate- or needle-shaped particles each consisting of a monocrystal can be obtained by grinding porous agglomerates of oriented grains or by grinding and screening or by separation from the other phases in a magnetic field at low temperatures (Meissner effect).

An effect which is called secondary recrystallization (also "giant grain growth") is known from the literature. In secondary recrystallization, grain growth occurs in a structure only in the case of a very small number of grains acting as nuclei. The remaining grains in the structure do not change very much until they are completely consumed by the growth of the nuclei. The nuclei can grow into grains of up to 1 mm. If the nuclei have a preferred orientation before the grain growth begins, secondary recrystallization will produce a structure having a corresponding texture. This phenomenon has been observed in, among other things, ceramic magnetic materials such as ferrites. In this connection, a ferrite powder was pressed in a magnetic field to form green compacts. After the sintering, secondary recrystallization produced a preferred direction of the grains which was apparently predetermined by the orientation of a few nuclei.

The following references relating to the background are quoted:

I-Wei Chen, et al., "Texture Development in $YBa_2Cu_3O_x$ by Hot Extrusion and Hot-Pressing", J.Am.Ceram. Soc. 70, December 1987, C-388 - C-390);

S. Hayashi et al., "Growth of $YBa_2Cu_3O_{9-}$ Single Crystals from the High Temperature Solution", Japanese Journal of Applied Physics, Vol.26, No. 7, July 1987, pp. L1197-L1198;

D. L Kaiser et al., "Growth of $YBa_2Cu_3O_x$ single crystals", Appl. Phys. Letters 51, 1987, 1040-1042;

P. Murugaraj et al., "Preparation of highly oriented Polycristalline $YBa_{2-y}Cu_3O_x$ Superconductors", Solid State Communications, Vol. 66, No. 7, 1988, pp. 735-738;

S. Vieira et al., "A simple device for quick separation of high-Tc superconducting materials", J. Phys.E:Sci. Instrum. 20, 1978, 1292-1293;

A. L. Stuijts, "Sintering of Ceramic Permanent Magnetic Material", Trans. Brit. Ceram. Soc. 55, 1956, 57-74.

SUMMARY OF THE INVENTION

The invention is based on the object of specifying a method for producing a wire- or band-shaped ceramic high-temperature superconductor of the $(Y,SE)Ba_2Cu_3O_{6.5+y}$ class with SE=rare earth metal and $0<y<1$, which ensures that as high as possible a critical current density, $j_c$, (current carrying capacity) will be reached and enables thin high-strength fibers, which can be easily further processed into multiple filaments, to be produced by simple, efficient and reproducible means. Critical current densities, $j_c$, which are at least of the order of magnitude of $10^4$ A/cm² are aimed for.

This object is achieved by the fact that, in the method initially mentioned, 80 to 95% by weight of an ultra-fine grained powder of globulitic particles having a maximum diameter of 1 μm of high-temperature superconductor ceramics of the $YBa_2Cu_3O_{\sim 7}$ composition or of an intermediate product of the $YBa_2Cu_3O_{\sim 5}$ composition are mixed with 0.5 to 3% by weight of a powder of needle- and plate-shaped particles having a length of 10 to 50 μm measured over the longest axis of high-temperature superconductor ceramics and 4 to 20% by weight of an organic binder in a solvent, are mixed, dispersed and suspended to form a suspension in such a manner that a highly viscous slip is created which is processed by extrusion or spinning to form a viscous strand having longitudinally oriented needle- and plate-shaped particles, and in that the said strand is dried and slowly heated in air step by step to 650° C. and finally to 850° to 950° C., during which process the organic components are decomposed, $H_2O$ and $CO_2$ is expelled and the whole is sintered to form a fiber of longitudinally oriented crystallites of the high-temperature superconductor.

The core of the invention consists in producing a superconducting ceramic body having a large longitudinal extent which consists of grains which are preferably oriented in the longitudinal direction. In the arrangement, the a-b plane of the crystallites lies along the longitudinal axis of the fiber whilst its c axis is transverse to the longitudinal direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
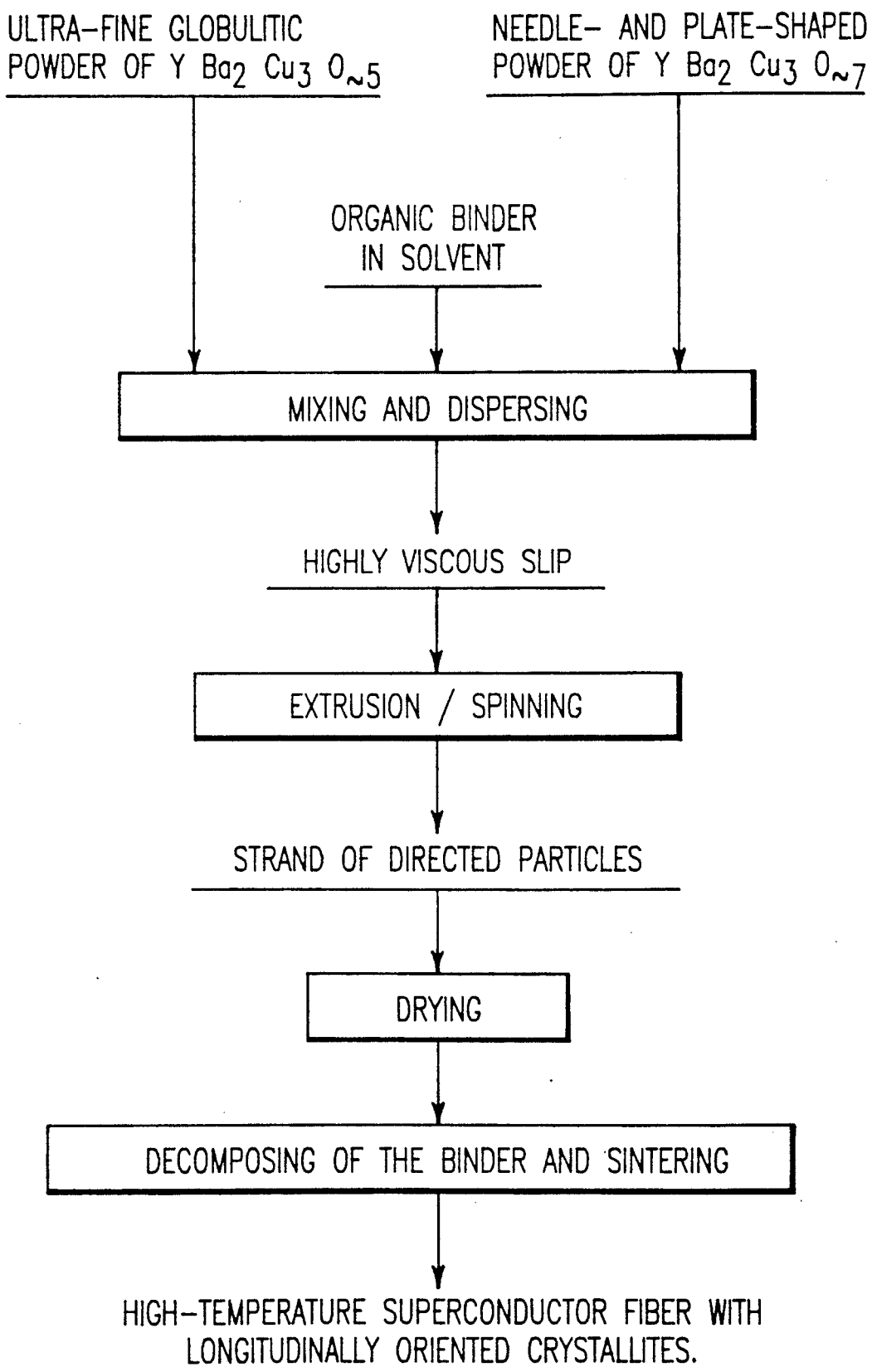
FIG. 1 shows a flow chart (block diagram) for producing a high-temperature superconductor fiber.

Referring now to the drawings, wherein like reference numerals designate identical or corresponding parts throughout the several views, FIG. 1 shows a flow chart as block diagram for producing a high-temperature superconductor fiber. The diagram also applies to the production of wire- or band-shaped ceramic high-temperature superconductors of any type. The diagram does not require any special comment. The ultra-fine grained globulitic powder is preferably obtained by coprecipitation from solutions containing Y, Ba and Cu salts. The methods mentioned under background of the invention are available for providing needle- and plate-shaped powder. The highly viscous slip is basically processed further by extrusion or spinning through a die or nozzle.

Figure 2:
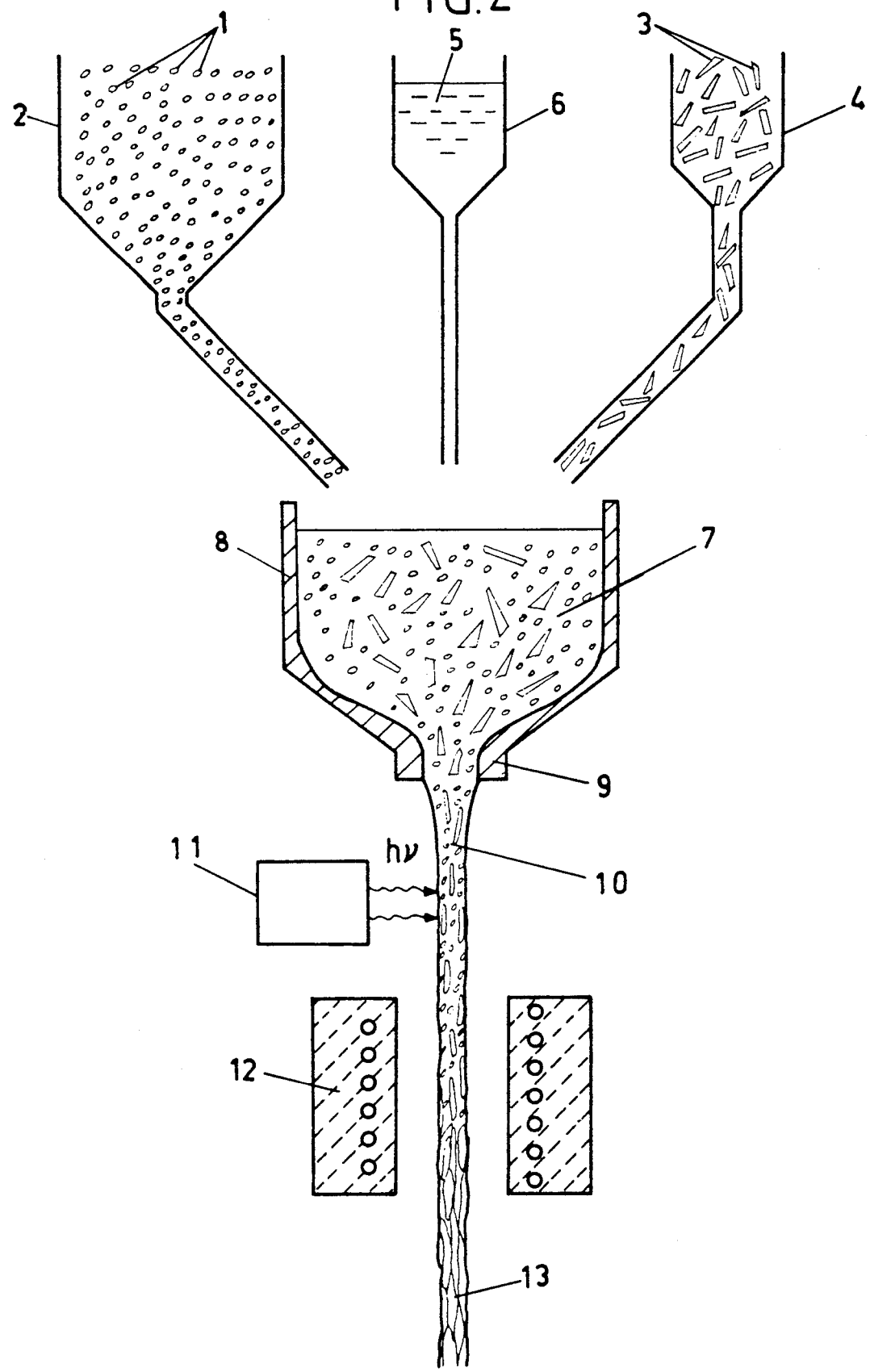
FIG. 2 shows a diagrammatic longitudinal section (elevation) through a device for producing a high-temperature superconductor fiber.

FIG. 2 relates to a diagrammatic longitudinal section (elevation) through a device for producing a ceramic high-temperature superconductor fiber. The device is shown simplified only in its basic elements. 1 is an ultra-fine grained powder of globulitic particles of a high-temperature superconductor ceramic or of a corresponding intermediate product (precursor). 2 is a container for the ultra-fine grained powder 1. 3 is a powder of needle- and plate-shaped particles of a high-temperature superconductor ceramic, each individual particle consisting of a single crystallite. 4 is a container for the powder 3 of needle-shaped particles. Container 6 contains an organic binder to which a solvent has been added (reference 5 for the mixture). A highly viscous slip 7 (suspending, suspension of solid particles in highly viscous "solution") is mixed from 1+3+5 in the vessel 8. Vessel 8 has at its lower end an outlet opening (nozzle, die) 9 for the passage of the slip 7. 10 represents the extruded viscous strand which contains particles of superconductor ceramics. The preferred texture of the needle- and plate-shaped particles in the longitudinal direction of the strand 10 is clearly emphasized. 11 is an infrared radiation source provided for drying the strand 10. The radiation is represented by the wavy lines (h) in the direction of the arrows. 12 is a furnace for the further heating of the strand 10. It is used for expelling and decomposing the organic binder and the solvent (expelling $H_2O$ and $CO_2$) and for the reactive sintering of the particles of superconductor ceramic. During this process, a considerable grain growth occurs in the longitudinal direction due to secondary recrystallization. The result is the fiber 13 (strand) of longitudinally oriented crystallites consisting of superconductor ceramic.

ILLUSTRATIVE EMBODIMENT 1

See FIGS. 1 and 2

Firstly, a mixture of insoluble carbonates and carbonate hydroxides at the atomic ratio $Y/Ba_2/Cu_3$ was precipitated from soluble nitrates of the elements Y, Ba and Cu in accordance with the coprecipitation method and this intermediate product was converted by annealing (expelling the $H_2O$ and $CO_2$) into a mixed oxide of the approximate composition $YBa_2Cu_3O\sim_5$ in the form of an ultra-fine grained powder. The mean particle size of this essentially globulitic powder 1 was approximately 0.3 $\mu$m. A porous agglomerate of comparably coarser oriented grains of the $YBa_2Cu_3O_7$ composition according to P. Murugaraj et al. (see above) was used as starting material for the powder 3 of needle- and plate-shaped particles. The agglomerate was ground and sorted. The mean dimensions of the crystallites—measured in the longest axis—were 30 $\mu$m on average. 85% by weight of the ultra-fine grained powder 1 were suspended with 1.5% by weight of the powder 3 of needle- and plate-shaped particles in isopropanol, dispersed and a glycol-based plasticizer and an organic binder were added. These inactive substances of solvent and binder 5 made up the rest, approximately 13.5% by weight of the mixture. The highly viscous slip 7 produced in this manner was filled into a vessel 8 from where it was extruded through an outlet opening 9 in the form of a fine nozzle to form a thin fiber (strand 10). As a result, the a-b planes of the crystallites of the powder 3 were oriented along the longitudinal fiber axis. The strand 10 was dried by means of infrared rays from the radiation source 11 in a single-pass process and individual fiber sections were slowly heated to 600° C. in an oxygen-containing atmosphere in a furnace 12 with resistance heating, and then to 900° C. and kept at this temperature for five hours. Accordingly, all organic substances were decomposed and the $H_2O$ and $CO_2$ expelled in the first phase. In the second phase, the reactive sintering was then carried out, in which all ultra-fine grained particles of the powder 1 were dissolved from the coarser oriented crystallites of the powder 3 by secondary recrystallization. Fiber 13 showed a texture which was predetermined by the orientation of the needle- and plate-shaped crystallites of the powder 3.

An examination found a critical current density, $j_c$, of approximately $10^4$ $A/cm^2$ at a temperature of 77K (boiling point of nitrogen) on the 80 $\mu$m thick fiber 13.

ILLUSTRATIVE EMBODIMENT 2 see FIGS. 1 and 2

Similarly to Example 1, an intermediate product in powder form, having the atomic ratio $Y/Ba_2/Cu_3$, was produced in accordance with the coprecipitation method, which intermediate product was converted into the superconducting ceramic substance of the approximate composition $YBa_2Cu_3O\sim_7$ by annealing at 950° C. in oxygen-containing atmosphere. The mean particle size of this ultra-fine grained globulitic powder 1 was approximately 0.5 μm. The powder 3 of needle- and plate-shaped particles having the approximate composition $YBa_2Cu_3O\sim_7$ was produced by separation from the remaining phases by means of grinding and screening according to D. L. Kaiser et al. (see above). The mean size of the crystallites measured over the longest axis was approximately 40 μm. 90% by weight of the ultra-fine grained powder 1 was dispersed with 1% by weight of the powder 3 of needle- and plate-shaped particles according to Example 1 in solvents with the addition of organic binders 5 and plasticized, suspended and processed into a highly viscous slip 7. The slip 7 was drained into an injection nozzle and extruded through a hollow needle with an outlet opening 9 of 120 μm diameter. The strand 10 was dried by means of infrared radiation source 11 and heated in a furnace 12 exactly as in Example 1. During this process, the organic components were decomposed and the whole was sintered together to form a fiber 13 with longitudinally oriented crystallites. The finished fiber 13 had an average diameter of 75 μm and achieved a critical current density of approximately $1.2 \times 10^4$ $A/cm^2$ at 77K.

ILLUSTRATIVE EMBODIMENT 3 see FIGS. 1 and 2

The process was similar to Example 1. An ultra-fine grained powder of the composition $YBa_2Cu_3O\sim_5$ with an average particle size of 0.4 μm was produced by coprecipitation and annealing. In accordance with a slightly modified process, coarser crystallites with a needle-shape structure of the same composition $YBa_2Cu_3O\sim_5$, that is to say with oxygen deficiency, were produced as powder 3. The two powders were mixed in a ratio of 95% by weight and 0.7% by weight, the rest being organic additives, in the same manner as specified in Example 1. The further processing of the slip 7 and of the strand 10 was also effected in accordance with the same step-by-step pattern of Example 1. In this process, the entire mass was converted into the high-temperature superconductor $YBa_2Cu_3O\sim_7$ with longitudinally directed texture (fiber 13) with the admission of oxygen. The current carrying capacity, measured as critical current density $j_c$, was approximately $2 \times 10^4$ $A/cm^2$ for the fiber 13 with a diameter of 60 μm.

The invention is not restricted to the illustrative embodiments.

The method for producing a wire- or band-shaped ceramic high-temperature superconductor basically consists in that 80 to 95% by weight of an ultra-fine grained powder 1 of globulitic particles with a maximum diameter of 1 μm of a high-temperature superconductor ceramic of the composition $YBa_2Cu_3O\sim_7$ or of an intermediate product of the composition $YBa_2Cu_3O\sim_5$ are mixed with 0.5 to 3% by weight of a powder 3 of needle- and plate-shaped particles having a length of 10 to 50 μm measured over the longest axis of a high-temperature superconductor ceramic and 4 to 20% by weight of an organic binder in a solvent 5, is dispersed and suspended to form a suspension in such a manner that a highly viscous slip 7 is created which is processed by extrusion or spinning to form a viscous strand 10 having longitudinally oriented needle- and plate-shaped particles, and the said strand 10 is dried and slowly heated in air step by step to 650° C. and finally to 850° to 950° C., during which process the organic components are decomposed, $H_2O$ and $CO_2$ are expelled and the whole is sintered to form a fiber 13 of longitudinally oriented crystallites of the high-temperature superconductor.

In a first variant of the method, the ultra-fine grained powder 1 of globulitic particles has precisely the same composition as the powder 3 of needle- and plate-shaped particles as corresponds to the formula $YBa_2Cu_3O\sim_5$.

In a second variant of the method, the ultra-fine grained powder 1 of globulitic particles has precisely the same composition as powder 3 of needle- and plate-shaped particles as corresponds to the formula $YBa_2Cu_3O\sim_7$.

It must be stressed that the new process is in no way restricted to high-temperature ceramic superconductors of the $(Y, SE)Ba_2Cu_3O_{6.5+y}$ class, but is applicable to superconductors of any composition having a needle- or plate-shaped crystalline structure and having preferred superconductor characteristics in the basic plane. This applies in particular to the $Tl_2Ba_2Cu_3O_{8+x}$ classes and the like, as well as to $Bi_2Sr_{3-x}Ca_xCu_2O_{8+y}$ classes and related classes.

Obviously numerous modifications and variations of the present invention are possible in the light of the above teachings. It is therefore to be understood that, within the scope of the appended claims, the invention may be practiced otherwise than as specifically described herein.

What is claimed as new and desired to be secured by Letters Patent of the United States is:

1. A method for producing a wire- or band-shaped ceramic high-temperature superconductor based on a super-conducting ceramic of the $YBa_2Cu_3O_{6.5+y}$ class with $0 < y < 1$, wherein 80 to 95% by weight of an ultra-fine grained powder (1) of globulitic particles having a maximum diameter of 1 μm of a high-temperature superconductor ceramic of the $YBa_2Cu_3O\sim_7$ composition or of an intermediate product of the $YBa_2Cu_3O\sim_5$ composition are mixed with 0.5 to 3% by weight of a powder (3) of needle- and plate-shaped particles, having a length of 10 to 50 μm measured over the longest axis, of a high-temperature superconductor ceramic of the $YBa_2Cu_3O \approx_7$ composition or of an intermediate product of the $YBa_2Cu_3O \approx_5$ composition and 4 to 20% by weight of an organic binder in a solvent (5), are mixed, dispersed and suspended to form a suspension in such a manner that a highly viscous slip (7) is created which is processed by extrusion or spinning to form a viscous strand (10) having longitudinally oriented needle- and plate-shaped particles and wherein the said strand (10) is dried and slowly heated in air step by step to 650° C. and finally to 850° to 950° C., during which process the organic components are decomposed, $H_2O$ and $CO_2$ are expelled and the whole is sintered to form a fiber (13) of longitudinally oriented crystallites of the high-temperature superconductor.

2. A method as claimed in claim 1, wherein the ultra-fine grained powder (1) of globulitic particles and the powder (3) of needle- and plate-shaped particles have precisely the same composition as corresponds to the formula $YBa_2Cu_3O\sim_5$.

3. A method as claimed in claim 1, wherein the ultra-fine grained powder (1) of globulitic particles and the powder (3) of needle- and plate-shaped particles has precisely the same composition as corresponds to the formula $YBa_2Cu_3O_{\sim 7}$.

4. A method for producing a wire- or band-shaped ceramic high temperature superconductor based on a superconducting ceramic of the $(SE)Ba_2Cu_3O_{6.5+y}$ class wherein SE is a rare earth metal and $0<y<1$, wherein 80 to 95% by weight of an ultra fine-grained powder (1) of globulitic particles having a maximum diameter of 1μm of a high temperature superconductor ceramic of the $(SE)Ba_2Cu_3O_{6.5 \approx 7}$ composition or of an intermediate product of the $(SE)Ba_2Cu_3O_{6.5 \approx 5}$ composition are mixed with 0.5 to 3% by weight of a powder (3) of needle- and plate-shaped particles, having a length of 10 to 50 μm measured over the longest axis, of a high temperature superconductor ceramic of the $(SE)Ba_2Cu_3O_{\approx 7}$ composition or of an intermediate product of the $(SE)Ba_2Cu_3O_{\approx 5}$ composition and 4 to 20% by weight of an organic binder in a solvent (5), are mixed, dispersed and suspended to form a suspension in such a manner that a highly viscous slip (7) is created which is processed by extrusion or spinning to form a viscous strand (10) having longitudinally oriented needle- and plate-shaped particles and wherein the said strand (10) is dried and slowly heated in air step by step to 650° C. and finally to 850° to 950° C., during which process the organic components are decomposed, $H_2O$ and $CO_2$ are expelled and the whole is sintered to form a fiber (13) of longitudinally oriented crystallites of the high-temperature superconductor.

* * * * *